(12) United States Patent
Park et al.

(10) Patent No.: US 11,011,675 B2
(45) Date of Patent: May 18, 2021

(54) SEMICONDUCTOR DEVICE AND SEMICONDUCTOR DEVICE PACKAGE INCLUDING SAME

(71) Applicant: LG INNOTEK CO., LTD., Seoul (KR)

(72) Inventors: Yong Nam Park, Seoul (KR); June O Song, Seoul (KR); Myeong Soo Kim, Seoul (KR); Seong Jun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 119 days.

(21) Appl. No.: 16/500,216

(22) PCT Filed: Apr. 3, 2018

(86) PCT No.: PCT/KR2018/003916
§ 371 (c)(1),
(2) Date: Oct. 2, 2019

(87) PCT Pub. No.: WO2018/186655
PCT Pub. Date: Oct. 11, 2018

(65) Prior Publication Data
US 2021/0098649 A1 Apr. 1, 2021

(30) Foreign Application Priority Data

Apr. 3, 2017 (KR) .................. 10-2017-0043051
Apr. 3, 2017 (KR) .................. 10-2017-0043052

(51) Int. Cl.
*H01L 33/00* (2010.01)
*H01L 33/08* (2010.01)
(Continued)

(52) U.S. Cl.
CPC ............ *H01L 33/08* (2013.01); *H01L 33/145* (2013.01); *H01L 33/387* (2013.01); *H01L 33/486* (2013.01); *H01L 33/62* (2013.01)

(58) Field of Classification Search
CPC .......... H01L 33/32; H01L 33/62; H01L 33/38; H01L 2924/00; H01L 33/20;
(Continued)

(56) References Cited

U.S. PATENT DOCUMENTS 8,309,971 B2 * 11/2012 Seo ................... H01L 33/20
257/79
9,070,834 B2 * 6/2015 Kim ................. H01L 33/382
(Continued)

FOREIGN PATENT DOCUMENTS

KR    10-2011-0083968    7/2011
KR    10-2011-0093248    8/2011
(Continued)

OTHER PUBLICATIONS

International Search Report dated Jul. 12, 2018 issued in Application No. PCT/KR2018/003916.

*Primary Examiner* — Savitri Mulpuri
(74) *Attorney, Agent, or Firm* — KED & Associates LLP

(57) ABSTRACT

Disclosed in an embodiment are a semiconductor device and a semiconductor device package including the same, the semiconductor device comprising: a semiconductor structure including a first light emitting unit and a second light emitting unit; a first electrode for electrically connecting a first conductive type semiconductor layer of the first light emitting unit with a first conductive type semiconductor layer of the second light emitting unit; and a second electrode for electrically connecting a second conductive type semiconductor layer of the first light emitting unit with a second conductive type semiconductor layer of the second light emitting unit, wherein: the first electrode includes a first pad arranged on the first light emitting unit, a first branch electrode arranged on the first light emitting unit, and a first extension electrode arranged on the second light emitting unit; the second electrode includes a second pad
(Continued)

arranged on the second light emitting unit, a second branch electrode arranged on the second light emitting unit, and a second extension electrode arranged on the first light emitting unit; the semiconductor structure includes a first spacing section which extends in a first direction and comparts the first light emitting unit and the second light emitting unit; and the first pad and the second pad are not overlapped in the first direction and a second direction which is perpendicular to the first direction.

18 Claims, 10 Drawing Sheets

(51) Int. Cl.
      *H01L 33/14*       (2010.01)
      *H01L 33/62*       (2010.01)
      *H01L 33/48*       (2010.01)
      *H01L 33/38*       (2010.01)

(58) Field of Classification Search
     CPC ..... H01L 2924/0002; H01L 2933/0016; H01L 33/08; H01L 33/145; H01L 33/387; H01L 33/486

See application file for complete search history.

(56) References Cited

U.S. PATENT DOCUMENTS

| | | | |
|---|---|---|---|
| 2009/0159909 A1* | 6/2009 | Lee | H01L 33/38 |
| | | | 257/96 |
| 2011/0163346 A1 | 7/2011 | Seo et al. | |
| 2011/0210352 A1* | 9/2011 | Lee | H01L 24/24 |
| | | | 257/93 |
| 2011/0278631 A1* | 11/2011 | Shen | H01L 33/38 |
| | | | 257/99 |
| 2014/0231859 A1* | 8/2014 | Kim | H01L 33/387 |
| | | | 257/99 |
| 2014/0367730 A1 | 12/2014 | Kim et al. | |

FOREIGN PATENT DOCUMENTS

| | | |
|---|---|---|
| KR | 10-2011-0098874 | 9/2011 |
| KR | 10-2014-0057805 | 5/2014 |
| KR | 10-2014-0146957 | 12/2014 |

* cited by examiner

[FIG. 1]
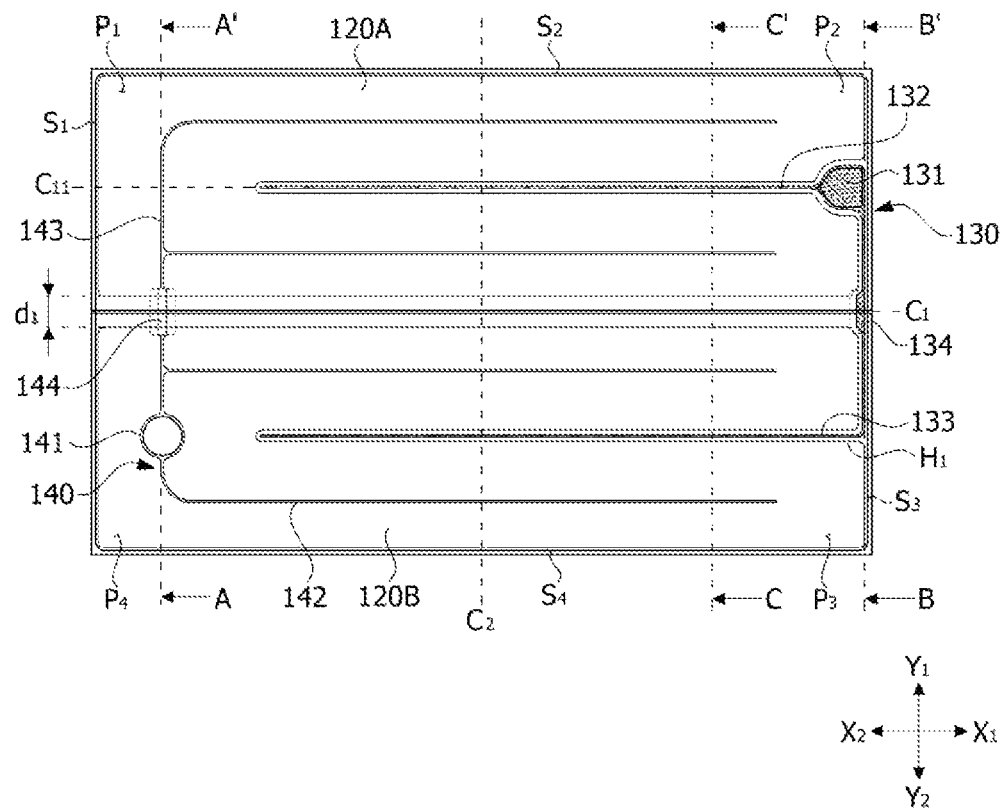
[FIG. 2]
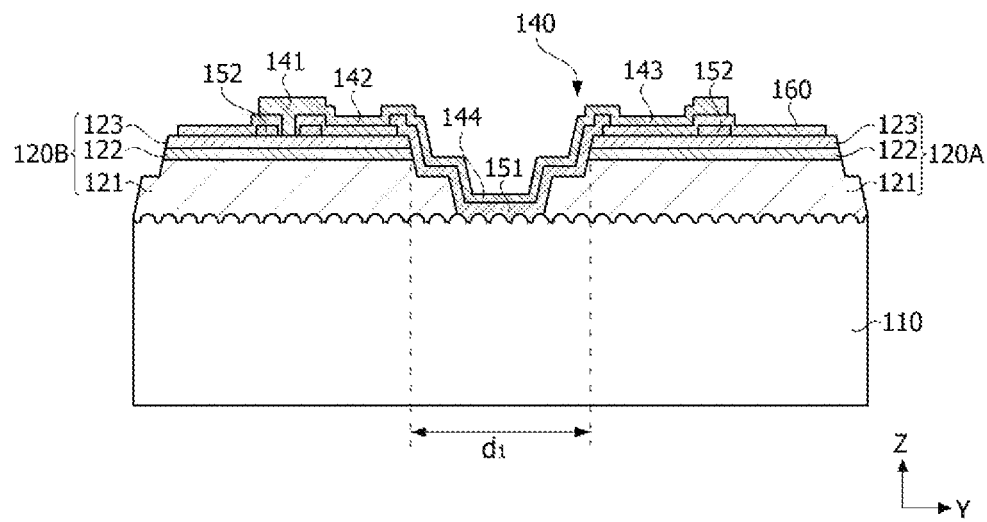

[FIG. 3]
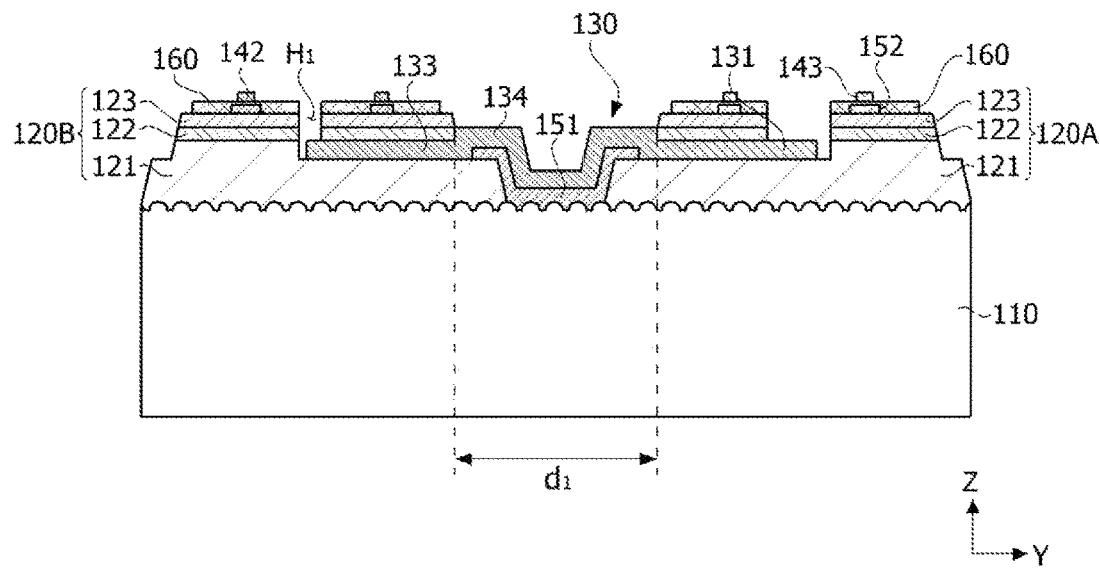
[FIG. 4]
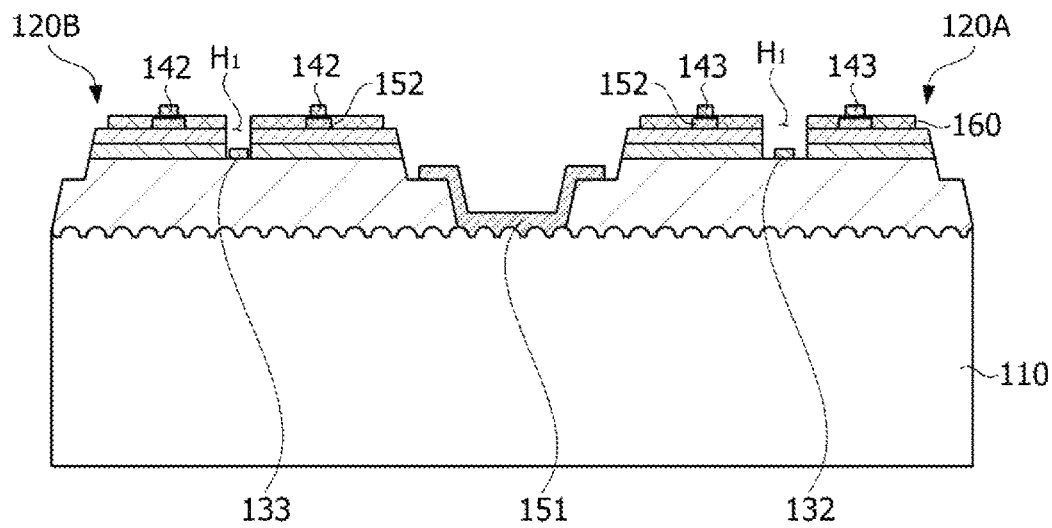

[FIG. 5]
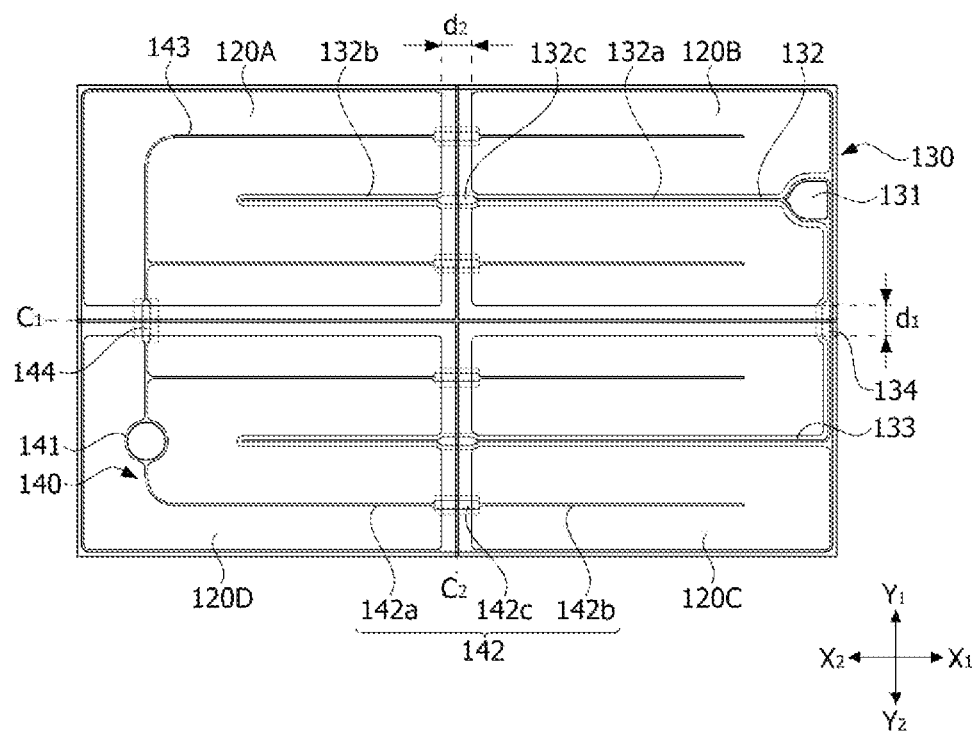

[FIG. 6]
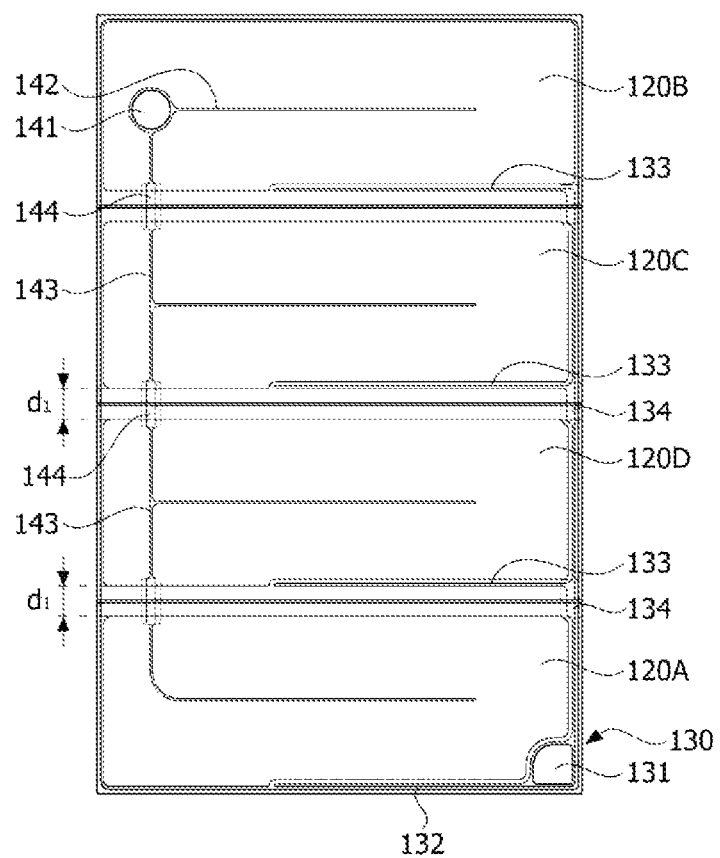

[FIG. 7]
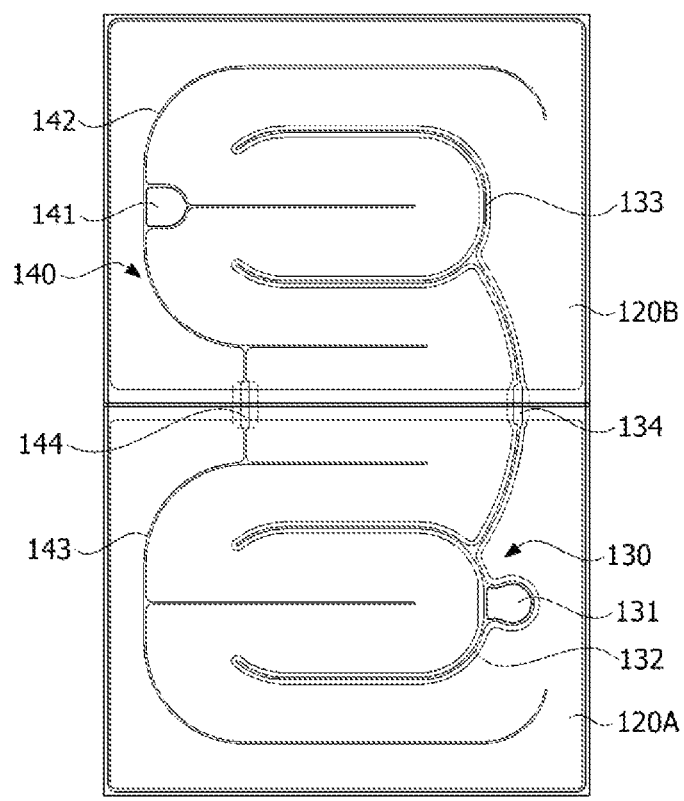

[FIG. 8]
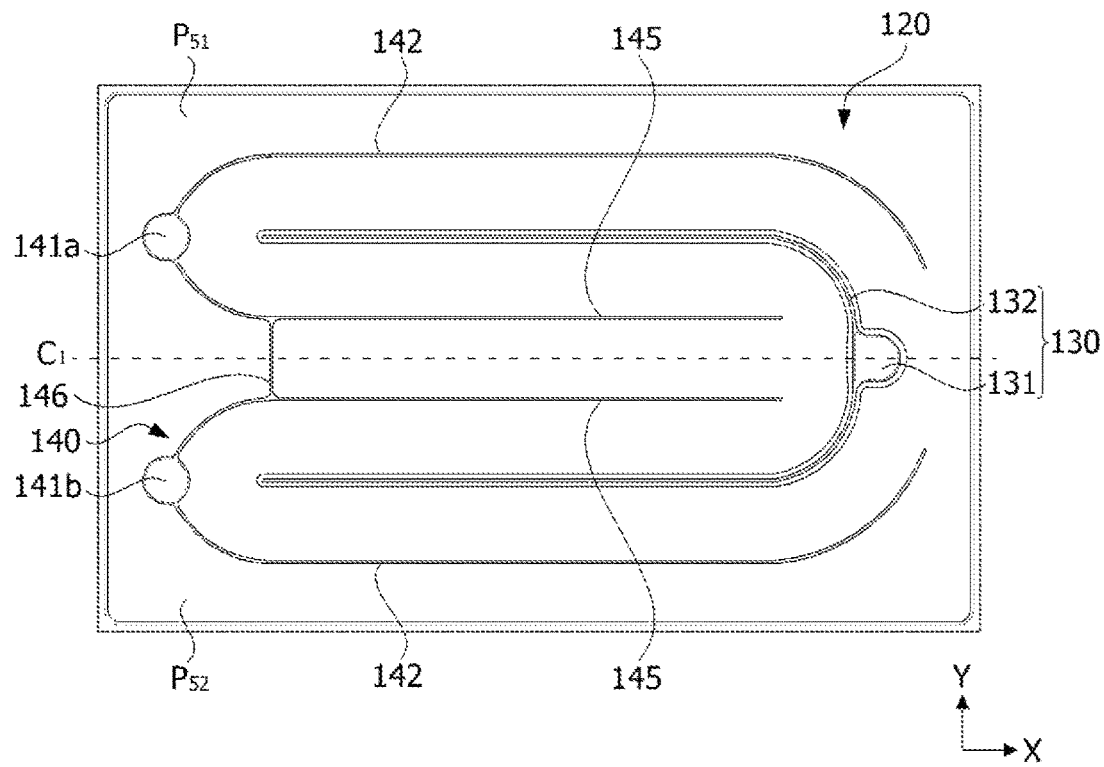
[FIG. 9]
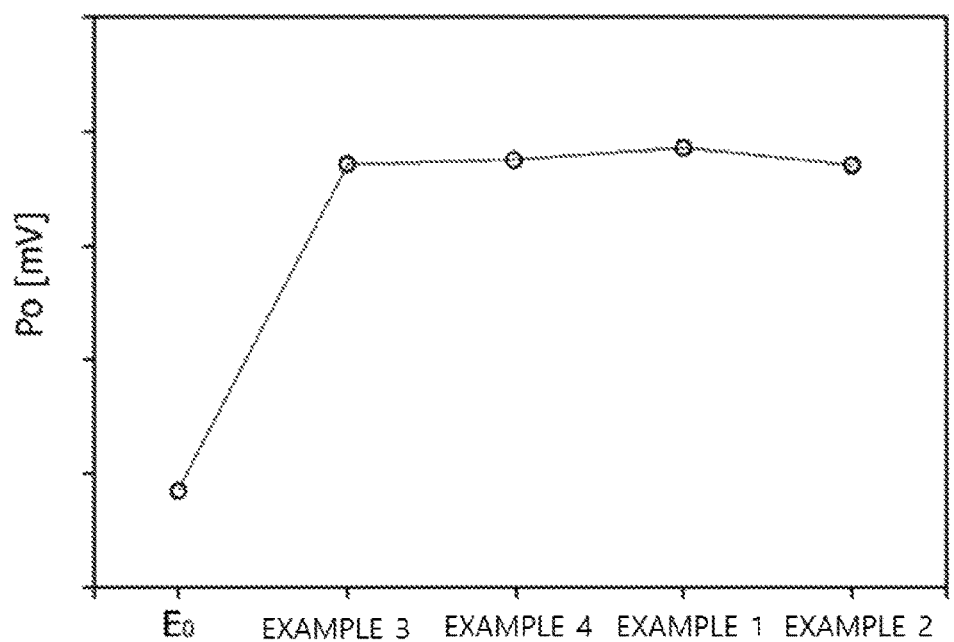

【FIG. 10】
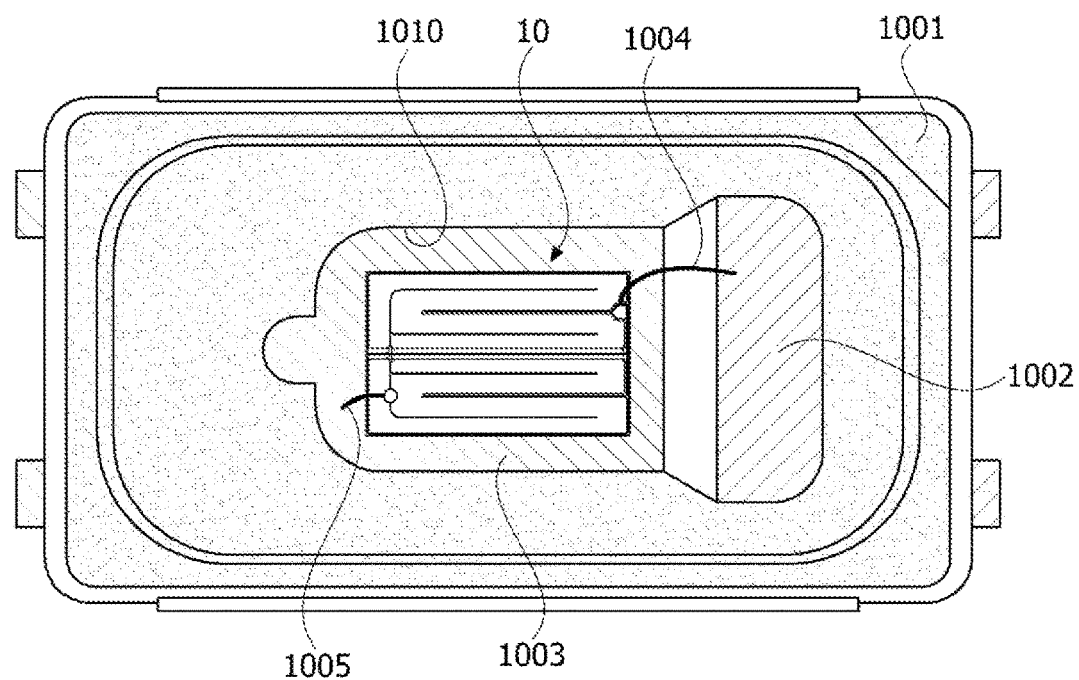

[FIG. 11]
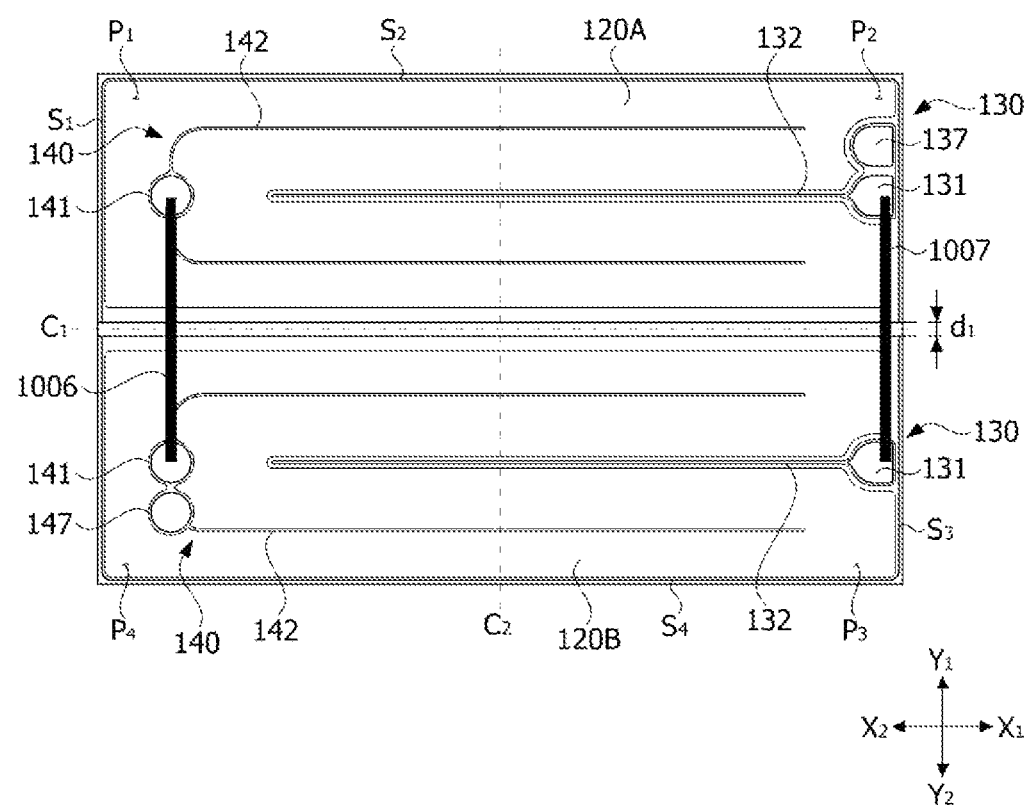

[FIG. 12A]
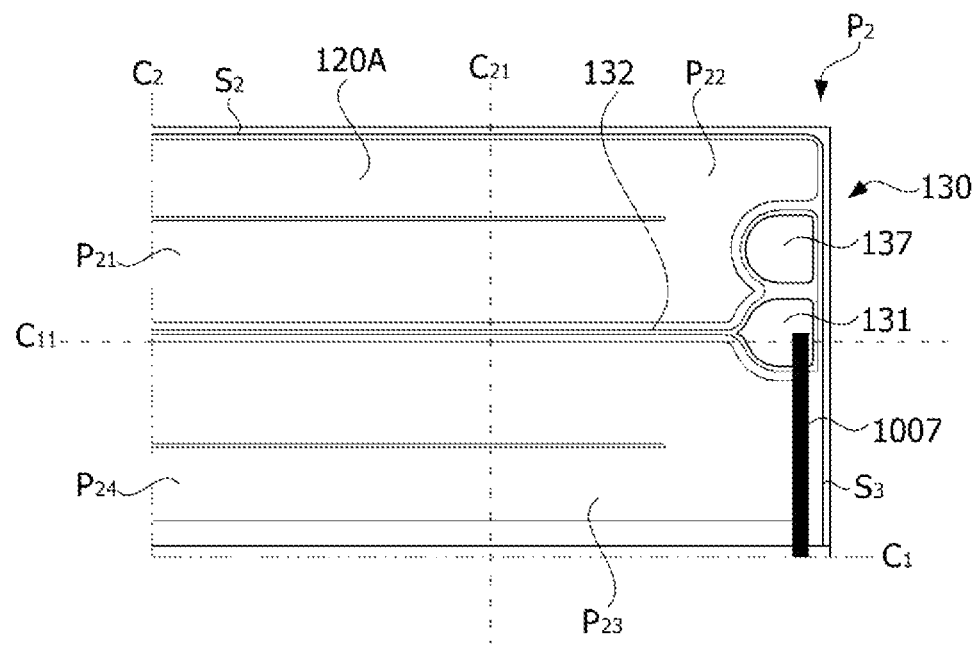
[FIG. 12B]
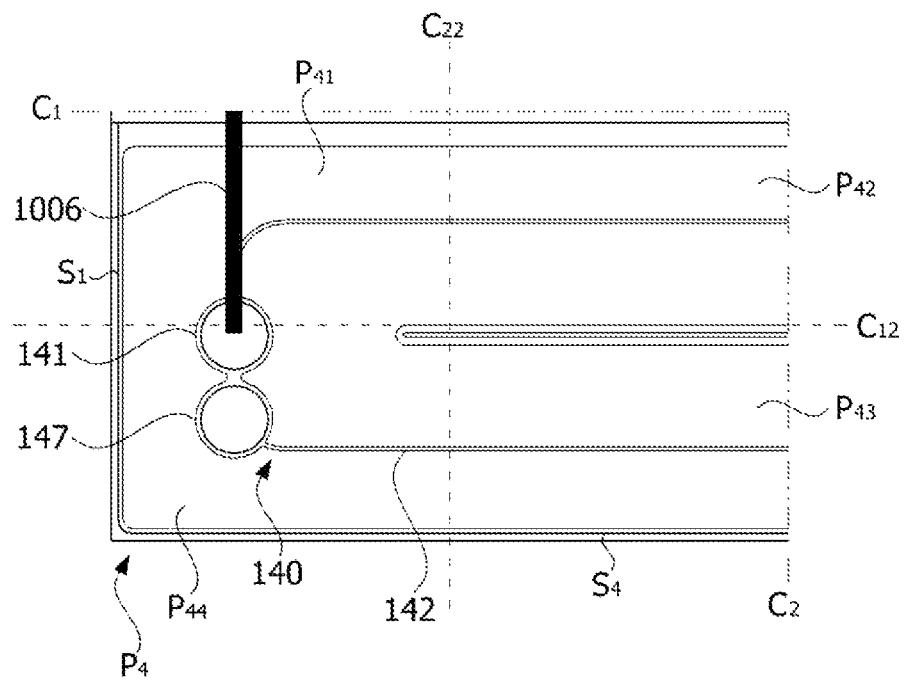

【FIG. 13】
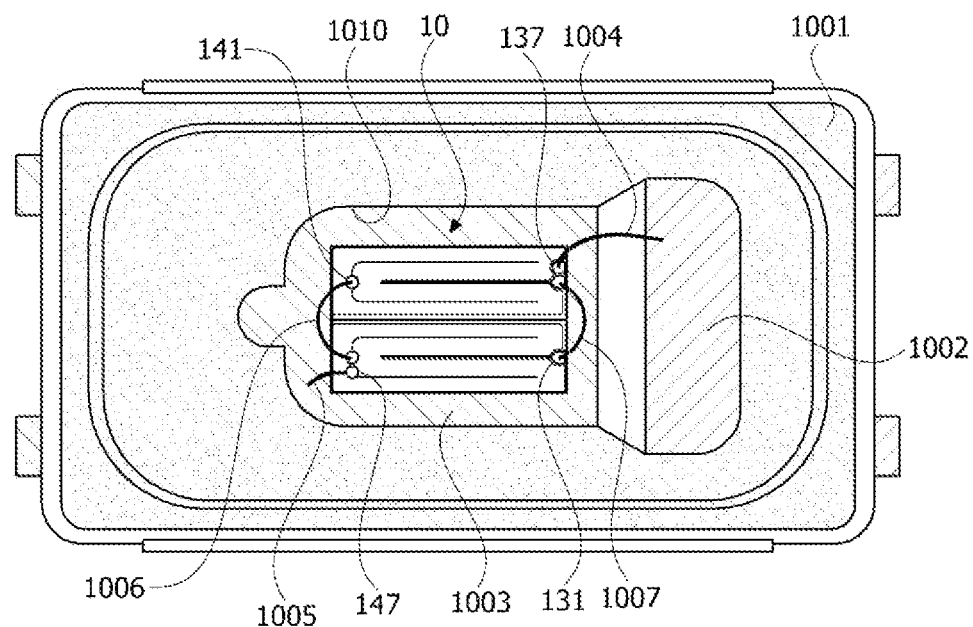

SEMICONDUCTOR DEVICE AND SEMICONDUCTOR DEVICE PACKAGE INCLUDING SAME

CROSS-REFERENCE TO RELATED PATENT APPLICATIONS

This application is a U.S. National Stage Application under 35 U.S.C. § 371 of PCT Application No. PCT/KR2018/003916, filed Apr. 3, 2018, which claims priority to Korean Patent Application Nos. 10-2017-0043051 and 10-2017-0043052 filed Apr. 3, 2017, whose entire disclosures are hereby incorporated by reference.

TECHNICAL FIELD

Embodiments relate to a semiconductor device and a semiconductor device package including the same.

BACKGROUND ART

Since semiconductor devices including compounds (e.g., gallium nitride (GaN) and aluminum gallium nitride (AlGaN)) have many merits, such as a wide and adjustable band gap energy, the semiconductor devices are being variously used as light-emitting devices, light-receiving devices, various kinds of diodes, and the like.

In particular, with the development of thin-film growth technology and device materials, light-emitting devices (e.g., light-emitting diodes (LEDs) or laser diodes) using Group III-V or II-VI compound semiconductor materials may implement various colors, such as red, green, and blue, and ultraviolet rays, and may implement efficient white light rays by using fluorescent materials or combining colors. As compared to conventional light sources, such as fluorescent lamps, incandescent lamps, and the like, the light-emitting devices have advantages of low power consumption, a semi-permanent lifespan, high response speed, safety, and environmental friendliness.

In addition, when light-receiving devices, such as photodetectors (PDs) or solar cells, are manufactured using Group III-V or II-VI compound semiconductor materials, due to the development of device materials, a photocurrent may be generated by absorbing light in various wavelength ranges. Thus, light in various wavelength ranges from a frequency band of gamma rays to a radio wavelength may be used. Further, the light-receiving devices have advantages of high response speed, safety, environmental friendliness, and easy adjustment of device materials, and thus the light-receiving devices may be easily applied to power control devices, ultrahigh frequency circuits, or communication modules.

Accordingly, the application of the semiconductor devices is being extended to transmission modules of optical communication units, LED backlights capable of replacing cold cathode fluorescence lamps (CCFLs) included in backlights of liquid crystal display (LCD) devices, white LED lighting devices capable of replacing fluorescent lamps or incandescent bulbs, car headlights, signal lamps, sensors configured to sense gas or fire, and the like. Furthermore, the application of the semiconductor devices may be extended to high-frequency application circuits, other power control devices, and communication modules.

Recently, a technique of connecting two semiconductor devices in parallel is being developed to realize a highly efficient package. However, when two chips are connected in parallel, the number of wire bonding processes is increased and an operating voltage between chips is not constant.

DISCLOSURE

Technical Problem

The present invention is directed to providing a semiconductor device in which a plurality of light-emitting portions are connected in parallel, and a semiconductor device package including the semiconductor device.

Technical Solution

One aspect of the present invention provides a semiconductor device including: a semiconductor structure including a first light-emitting portion and a second light-emitting portion; a first electrode configured to electrically connect a first-conductive-type semiconductor layer of the first light-emitting portion to a first-conductive-type semiconductor layer of the second light-emitting portion; and a second electrode configured to electrically connect a second-conductive-type semiconductor layer of the first light-emitting portion to a second-conductive-type semiconductor layer of the second light-emitting portion. The first electrode includes a first pad disposed on the first light-emitting portion, a first branch electrode disposed on the first light-emitting portion, and a first extension electrode disposed on the second light-emitting portion. The second electrode includes a second pad disposed on the second light-emitting portion, a second branch electrode disposed on the second light-emitting portion, and a second extension electrode disposed on the first light-emitting portion. The semiconductor structure includes a first separation section extending in a first direction to separate the first light-emitting portion from the second light-emitting portion, and the first pad does not overlap the second pad in the first direction and a second direction perpendicular to the first direction.

The semiconductor structure may include first to fourth regions, which are divided by a first side surface and a third side surface which are opposite to each other, a second side surface and a fourth side surface which are opposite to each other, a first central line bisecting the first side surface, and a second central line bisecting the second side surface when viewed from above. The first region may include the first side surface and the second side surface, the second region may include the second side surface and the third side surface, the third region may include the third side surface and the fourth side surface, and the fourth region may include the fourth side surface and the first side surface. The first pad may be disposed in the second region, and the second pad may be disposed in the fourth region.

The first electrode and the second electrode may connect the first light-emitting portion to the second light-emitting portion in parallel.

The number of second branch electrodes may be larger than the number of first branch electrodes.

The semiconductor device may further include a current blocking layer disposed below the second branch electrode.

The first electrode may include a first connecting portion disposed on the first separation section, and a width of the first connecting portion may be greater than a width of the first branch electrode.

The first branch electrode may be disposed on a virtual line bisecting the first light-emitting portion in the first direction.

The semiconductor device may further include a second separation section extending in the second direction to separate the first light-emitting portion from the second light-emitting portion, and the first central line may be disposed in the second separation section.

The first electrode may include a second connecting portion disposed on the second separation section, and a width of the second connecting portion may be greater than a width of the second branch electrode.

Another aspect of the present invention provides a semiconductor device package including: a body including a cavity; a first lead frame and a second lead frame disposed on the body; a semiconductor device disposed in the cavity; a first wire configured to electrically connect a first pad of the semiconductor device to the first lead frame; and a second wire configured to electrically connect a second pad of the semiconductor device to the second lead frame. The semiconductor device includes: a semiconductor structure including a first light-emitting portion and a second light-emitting portion; a first electrode configured to electrically connect a first-conductive-type semiconductor layer of the first light-emitting portion to a first-conductive-type semiconductor layer of the second light-emitting portion; and a second electrode configured to electrically connect a second-conductive-type semiconductor layer of the first light-emitting portion to a second-conductive-type semiconductor layer of the second light-emitting portion. The first electrode includes the first pad disposed on the first light-emitting portion, a first branch electrode disposed on the first light-emitting portion, and a first extension electrode disposed on the second light-emitting portion. The second electrode includes the second pad disposed on the second light-emitting portion, a second branch electrode disposed on the second light-emitting portion, and a second extension electrode disposed on the first light-emitting portion. The semiconductor structure includes a first separation section extending in a first direction to separate the first light-emitting portion from the second light-emitting portion, and the first pad does not overlap the second pad in the first direction and a second direction perpendicular to the first direction.

Still another aspect of the present invention provides a semiconductor device package including: a body including a cavity; a first lead frame and a second lead frame disposed on the body; a semiconductor structure including a first light-emitting portion and a second light-emitting portion disposed in the cavity; a first wire and a second wire configured to electrically connect the first and second light-emitting portions to the first and second lead frames; and a third wire and a fourth wire configured to connect the first light-emitting portion to the second light-emitting portion in parallel. Each of the first and second light-emitting portions includes a first-conductive-type semiconductor layer, a second-conductive-type semiconductor layer, an active layer disposed between the first-conductive-type semiconductor layer and the second-conductive-type semiconductor layer, a first electrode electrically connected to the first-conductive-type semiconductor layer, and a second electrode electrically connected to the second-conductive-type semiconductor layer. The first electrode includes a first pad, a first sub-pad, and a first branch electrode, and the second electrode includes a second pad, a second sub-pad, and a second branch electrode. The first wire electrically connects the first sub-pad to the first lead frame, and the second wire electrically connects the second sub-pad to the second lead frame. The third wire electrically connects the first pad of the first light-emitting portion to the first pad of the second light-emitting portion, and the fourth wire electrically connects the second pad of the first light-emitting portion to the second pad of the second light-emitting portion.

The semiconductor structure may include a first separation section extending in a first direction to separate the first light-emitting portion from the second light-emitting portion. The first sub-pad may not overlap the second sub-pad in the first direction and a second direction perpendicular to the first direction.

The semiconductor structure may include first to fourth regions, which are divided by a first side surface and a third side surface which are opposite to each other, a second side surface and a fourth side surface which are opposite to each other, a first central line bisecting the first side surface, and a second central line bisecting the second side surface when viewed from above. The first region may include the first side surface and the second side surface, and the second region may include the second side surface and the third side surface. The third region may include the third side surface and the fourth side surface, and the fourth region may include the fourth side surface and the first side surface. The first sub-pad is disposed in the second region, and the second sub-pad is disposed in the fourth region.

The first and second wires may include a different material from the third and fourth wires.

The third and fourth wires may include silver (Ag).

Advantageous Effects

According to exemplary embodiments, operating voltages of a plurality of light-emitting portions can be constant, thereby improving optical efficiency.

Further, the number of wire bonding processes can be reduced during the manufacture of a package.

In addition, resistance between a plurality of chips can be reduced.

Various advantageous merits and effects of the present invention are not limited to the above descriptions and will be easily understood with reference to the descriptions of specific exemplary embodiments of the present invention.

DESCRIPTION OF DRAWINGS

FIG. 1 is a plan view of a semiconductor device according to a first exemplary embodiment of the present invention.

FIG. 2 is a sectional view taken along line A-A of FIG. 1.

FIG. 3 is a sectional view taken along line B-B of FIG. 1.

FIG. 4 is a sectional view taken along line C-C of FIG. 1.

FIG. 5 is a plan view of a semiconductor device according to a second exemplary embodiment of the present invention.

FIG. 6 is a plan view of a semiconductor device according to a third exemplary embodiment of the present invention.

FIG. 7 is a plan view of a semiconductor device according to a fourth exemplary embodiment of the present invention.

FIG. 8 is a plan view of a semiconductor device according to a fifth exemplary embodiment of the present invention.

FIG. 9 is a graph showing measurement results of emission intensities (Po) of a Comparative Example and Examples.

FIG. 10 is a plan view of a semiconductor device package according to an exemplary embodiment of the present invention.

FIG. 11 is a plan view of a semiconductor device according to a sixth exemplary embodiment of the present invention.

FIG. 12A is an enlarged view of a second region of FIG. 11.

FIG. 12B is an enlarged view of a fourth region of FIG. 11.

FIG. 13 is a plan view of a semiconductor device package according to another exemplary embodiment of the present invention.

MODES OF THE INVENTION

The present embodiments may be modified in other forms, or several embodiments may be combined with one another. The scope of the present invention is not limited to each of the embodiments described below.

Even when content described in a specific embodiment is not described in other embodiments, the content may be understood as being related to other embodiments unless otherwise described or unless the content contradicts specific embodiment in the other embodiments.

For example, when features of a component A are described in a specific embodiment and features of a component B are described in another embodiment, it should be understood that embodiments in which the component A is combined with the component B fall within the scope and spirit of the present invention even when they are not explicitly described.

In the description of exemplary embodiments, it will be understood that when an element is referred to as being formed "on (above) or under (below)" another element, the two elements can be in direct contact with each other or can be indirectly formed with at least one element disposed therebetween. Further, exemplary terms "on (above) or under (below)" can encompass both an orientation of above and below based on one element.

Hereinafter, exemplary embodiments of the present invention will be described in detail with reference to the accompanying drawings so that one skilled in the art may easily implement the present invention.

FIG. 1 is a plan view of a semiconductor device according to a first exemplary embodiment of the present invention. FIG. 2 is a sectional view taken along line A-A of FIG. 1. FIG. 3 is a sectional view taken along line B-B of FIG. 1. FIG. 4 is a sectional view taken along line C-C of FIG. 1.

Referring to FIG. 1, the semiconductor device according to the exemplary embodiment includes semiconductor structures 120A and 120B, which are a first light-emitting portion 120A and a second light-emitting portion 120B, and a first electrode 130 and a second electrode 140 which connect the first light-emitting portion 120A and the second light-emitting portion 120B in parallel.

The first light-emitting portion 120A and the second light-emitting portion 120B may be isolated light-emitting cells. The light-emitting portions may be defined as regions independently having an active layer. A first separation section d1 extending in a first direction (an X-axial direction) may be disposed between the first light-emitting portion 120A and the second light-emitting portion 120B. The first light-emitting portion 120A and the second light-emitting portion 120B may be spaced apart from each other in a second direction (a Y-axial direction) on the basis of the first separation section d1.

The first electrode 130 may include a first pad 131 disposed on the first light-emitting portion 120A, a first branch electrode 132 disposed on the first light-emitting portion 120A, and a first extension electrode 133 disposed on the second light-emitting portion 120B.

The first electrode 130 may electrically connect a first-conductive-type semiconductor layer of the first light-emitting portion 120A to a first-conductive-type semiconductor layer of the second light-emitting portion 120B. The first electrode 130 may include at least one of aluminum (Al), titanium (Ti), chromium (Cr), nickel (Ni), copper (Cu), and gold (Au) and may be formed to have a single layer or multilayered structure.

The first pad 131 may be a region to which a wire is bonded. A shape of the first pad 131 is not specifically limited. The first branch electrode 132 and a second extension electrode 143 may extend in an (1-2)th direction (an X2 direction). Widths of the first branch electrode 132 and the first extension electrode 133 are not specifically limited.

The first electrode 130 may include a first connecting portion 134 configured to connect the first branch electrode 132 to the first extension electrode 133. The first connecting portion 134 may be disposed in the first separation section d1. A width of the first connecting portion 134 may be greater than the widths of the first branch electrode 132 and the first extension electrode 133.

A ratio of the width of the first branch electrode 132 to the width of the first connecting portion 134 may range from 1:2 to 1:5. When the width ratio is lower than 1:2 (e.g., 1:1.5), the first connecting portion 134 may be cut due to a step of the first separation section d1. When the width ratio is higher than 1:5, an emission area may be relatively reduced, and thus, luminous efficiency may be reduced. As an example, the widths of the first branch electrode 132 and the first extension electrode 133 may range from 2 μm to 6 μm, and the width of the first connecting portion 134 may range from 10 μm to 30 μm, but the widths are not limited thereto.

The second electrode 140 may include a second pad 141 disposed on the second light-emitting portion 120B, a second branch electrode 142 disposed on the second light-emitting portion 120B, and the second extension electrode 143 disposed on the first light-emitting portion 120A.

The second electrode 140 may electrically connect a second-conductive-type semiconductor layer of the first light-emitting portion 120A to a second-conductive-type semiconductor layer of the second light-emitting portion 120B. The second electrode 140 may include at least one of aluminum (Al), titanium (Ti), chromium (Cr), nickel (Ni), copper (Cu), and gold (Au) and may be formed to have a single layer or a multilayered structure.

The second pad 141 may be a region to which a wire is bonded. For the sake of distinction, the second pad 141 may have a shape different from that of the first pad 131. As an example, the second pad 141 may have a circular shape but is not limited thereto. The second branch electrode 142 and the second extension electrode 143 may extend in a (1-1)th direction (X1 direction). Widths of the second branch electrode 142 and the second extension electrode 143 may not be specifically limited. As an example, the widths of the second branch electrode 142 and the second extension electrode 143 may range from 2 μm to 6 μm.

The second electrode 140 may include a second connecting portion 144 configured to connect the second branch electrode 142 to the second extension electrode 143. The second connecting portion 144 may be disposed on the first separation section d1. A width of the second connecting portion 144 may be greater than the widths of the second branch electrode 142 and the second extension electrode 143. For the same reason as the first connecting portion 134, a ratio of the width of the second branch electrode 142 to the width of the second connecting portion 144 may satisfy a range of 1:2 to 1:5.

The number of second branch electrodes 142 may be greater than the number of first branch electrodes 132. Hole injection efficiency may be improved by increasing the number of the second branch electrodes 142. Further, the first branch electrode 132 may be disposed on a virtual line which bisects the first light-emitting portion 120A in the first direction. Since the first branch electrode 132 is disposed in the center of the first light-emitting portion 120A, electrons may be uniformly distributed.

When viewed from above, the semiconductor device may include first to fourth regions P1, P2, P3, and P4, which are divided by a first side surface S1 and a third side surface S3 which are opposite to each other, a second side surface S2 and a fourth side surface S4 which are opposite to each other, a first central line C1 bisecting the first side surface S1, and a second central line C2 bisecting the second side surface S2. The first to fourth side surfaces S1, S2, S3, and S4 may form an outermost surface of the semiconductor device or a substrate 110.

The first region P1 may include the first side surface S1 and the second side surface S2, and the second region P2 may include the second side surface S2 and the third side surface S3. The third region P3 may include the third side surface S3 and the fourth side surface S4, and the fourth region P4 may include the fourth side surface S4 and the first side surface S1.

According to an embodiment, the first pad 131 may be disposed in the second region P2, and the second pad 141 may be disposed in the fourth region P4. That is, the first pad 131 and the second pad 141 may be disposed in a diagonal direction when viewed from above. Due to the above-described configuration, current distribution efficiency may be improved. When both the first pad 131 and the second pad 141 are disposed only in the first light-emitting portion 120A, an emission intensity of the first light-emitting portion 120A may be higher than that of the second light-emitting portion 120B, thereby degrading uniformity in such a case.

Further, when the first pad 131 is disposed in the first region P1 and the second pad 141 is disposed in the fourth region P4 (when the first pad 131 overlaps the second pad 141 in the second direction), current distribution efficiency may be reduced. Accordingly, the first pad 131 and the second pad 141 may be disposed in a diagonal direction such that the first pad 131 does not overlap the second pad 141 in the second direction (Y-axial direction).

Referring to FIG. 2, each of the first light-emitting portion 120A and the second light-emitting portion 120B may include a first-conductive-type semiconductor layer 121, an active layer 122, and a second-conductive-type semiconductor layer 123.

The first-conductive-type semiconductor layer 121 may be implemented as a Group III-V or Group II-VI compound semiconductor and doped with a first dopant. The first-conductive-type semiconductor layer 121 may be selected from semiconductor materials (e.g., GaN, AlGaN, InGaN, InAlGaN, and the like) having a composition formula of $In_{x1}Al_{y1}Ga_{1-x1-y1}N$ ($0 \le x1 \le 1$, $0 \le y1 \le 1$, and $0 \le x1+y1 \le 1$). Further, the first dopant may be an n-type dopant such as silicon (Si), germanium (Ge), tin (Sn), selenium (Se), and tellurium (Te). When the first dopant is an n-type dopant, the first-conductive-type semiconductor layer 121 doped with the first dopant may be an n-type semiconductor layer.

The active layer 122 may be disposed between the first-conductive-type semiconductor layer 121 and the second-conductive-type semiconductor layer 123. The active layer 122 may be a layer in which electrons (or holes) injected through the first-conductive-type semiconductor layer 121 are combined with holes (or electrons) injected through the second-conductive-type semiconductor layer 123. The active layer 122 may be transitioned to a low energy level due to recombination between the electrons and the holes, thus producing visible light or ultraviolet (UV) light.

The active layer 122 may include a well layer and a barrier layer and have any one of a single well structure, a multi-well structure, a single quantum well (SQW) structure, a multi-quantum well (MQW) structure, a quantum dot structure, or a quantum wire structure but is not limited thereto.

The second-conductive-type semiconductor layer 123 may be formed on the active layer 122, implemented as a Group III-V or Group II-VI compound semiconductor, and doped with a second dopant. The second-conductive-type semiconductor layer 123 may be formed of a semiconductor material having a composition formula of $In_{x5}Al_{y2}Ga_{1-x5-y2}N$ ($0 \le x5 \le 1$, $0 \le y2 \le 1$, and $0 \le x5+y2 \le 1$) or a material selected from AlInN, AlGaAs, GaP, GaAs, GaAsP, and AlGaInP. When the second dopant is a p-type dopant, such as magnesium (Mg), zinc (Zn), calcium (Ca), strontium (Sr), and barium (Ba), the second-conductive-type semiconductor layer 123 doped with the second dopant may be a p-type semiconductor layer.

An ohmic contact layer 160 may be disposed on the second-conductive-type semiconductor layer 123. The ohmic contact layer 160 may be formed to include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, iridium oxide (IrOx), ruthenium oxide (RuOx), nickel oxide (NiO), RuOx/ITO, Ni/IrOx/Au, Ni/IrOx/Au/ITO, silver (Ag), nickel (Ni), chromium (Cr), titanium (Ti), aluminum (Al), rhodium (Rh), palladium (Pd), iridium (Ir), tin (Sn), indium (In), ruthenium (Ru), magnesium (Mg), zinc (Zn), platinum (Pt), gold (Au), and hafnium (Hf) but is not limited thereto.

An insulating layer 151 may be disposed between the first light-emitting portion 120A and the second light-emitting portion 120B. The insulating layer 151 may be formed of at least one selected from the group consisting of $SiO_2$, $Si_xO_y$, $Si_3N_4$, $Si_xN_y$, $SiO_xN_y$, $Al_2O_3$, $TiO_2$, and AlN but is not limited thereto.

The second electrode 140 may include the second pad 141 disposed on the second light-emitting portion 120B, the second branch electrode 142 disposed on the second light-emitting portion 120B, and the second extension electrode 143 disposed on the first light-emitting portion 120A.

The second pad 141 and the second branch electrode 142 may be disposed on the second-conductive-type semiconductor layer 123 of the second light-emitting portion 120B, and the second extension electrode 143 may be disposed on the second-conductive-type semiconductor layer 123 of the first light-emitting portion 120A. The second connecting portion 144 may connect the second branch electrode 142 to the second extension electrode 143.

A current blocking layer (CBL) 152 may be disposed below the first branch electrode 132 and the second extension electrode 143. The CBL 152 may be disposed in a region that overlaps the second electrode 140 in a vertical direction. Thus, a current crowding phenomenon may be alleviated to improve the luminous efficiency of a light-emitting device.

The CBL 152 may be formed of a material that has an electrical insulating characteristic or forms a Schottky contact. The CBL 152 may be formed of an oxide, a nitride, or a metal. As an example, the CBL 152 may include at least one of SiO2, SiOx, SiOxNy, Si3N4, Al2O3, TiOx, Ti, Al, and Cr.

Referring to FIGS. 1 and 3, the first electrode 130 may include the first pad 131 disposed on the first light-emitting portion 120A, the first branch electrode 132 disposed on the first light-emitting portion 120A, and the first extension electrode 133 disposed on the second light-emitting portion 120B.

The first pad 131 and the first branch electrode 132 may be disposed on the first-conductive-type semiconductor layer 121 of the first light-emitting portion 120A, and the first extension electrode 133 may be disposed on the first-conductive-type semiconductor layer 121 of the second light-emitting portion 120B. A groove H1 corresponding to the first electrode 130 may be formed to expose the first electrode 130 in the first light-emitting portion 120A and the second light-emitting portion 120B Referring to FIGS. 1 and 4, the first branch electrode 132, the first extension electrode 133, the second branch electrode 142, and the second extension electrode 143 may be alternately disposed. The first extension electrode 133 may be disposed between adjacent second branch electrodes 142. Further, the first branch electrode 132 may be disposed between adjacent second extension electrodes 143.

The CBL 152 may be disposed below the second branch electrode 142 and the second extension electrode 143. The second branch electrode 142 and the second extension electrode 143 may be disposed on the ohmic contact layer 160 and electrically connected to the second-conductive-type semiconductor layer 123, while the first branch electrode 132 and the first extension electrode 133 may be in direct contact with the first-conductive-type semiconductor layer 121. The first electrode 130 and the second electrode 140 may include at least one selected from chromium (Cr), vanadium (V), tungsten (W), titanium (Ti), zinc (Zn), nickel (Ni), copper (Cu), aluminum (Al), gold (Au), molybdenum (Mo), titanium/gold/titanium/platinum/gold (Ti/Au/Ti/Pt/Au), nickel/gold/titanium/platinum/gold (Ni/Au/Ti/Pt/Au), chromium/aluminum/nickel/copper/nickel/gold (Cr/Al/Ni/Cu/Ni/Au), and the like.

FIG. 5 is a plan view of a semiconductor device according to a second exemplary embodiment of the present invention.
FIG. 6 is a plan view of a semiconductor device according to a third exemplary embodiment of the present invention.
FIG. 7 is a plan view of a semiconductor device according to a fourth exemplary embodiment of the present invention.
FIG. 8 is a plan view of a semiconductor device according to a fifth exemplary embodiment of the present invention.

Referring to FIG. 5, the semiconductor device according to the exemplary embodiment may include four light-emitting portions 120A, 120B, 120C, and 120D. When viewed from above, the semiconductor device may include a first side surface S1 and a third side surface S3 which are opposite to each other and a second side surface S2 and a fourth side surface S4 which are opposite to each other, and may be divided into the four light-emitting portions 120A, 120B, 120C, and 120D by a first separation section d1 bisecting the first side surface S1 and a second separation section d2 bisecting the second side surface S2. A semiconductor structure may be divided into more light-emitting portions in the same manner as described above.

According to an embodiment, a first pad 131 may be disposed in the second light-emitting portion 120B, and a second pad 141 may be disposed in the fourth light-emitting portion 120D. That is, the first pad 131 and the second pad 141 may be disposed in a diagonal direction when viewed from above.

The configurations described with reference to FIG. 1 may be wholly applied to the first electrode 130 and the second electrode 140. In addition, the first electrode 130 and the second electrode 140 may include horizontal connecting portions 132c and 142c disposed on the second separation section d2.

As an example, the horizontal connecting portion 132c of a first branch electrode 132 may electrically connect a (1-1)th branch electrode 132b disposed in a first light-emitting portion 120A to a (1-2)th branch electrode 132a disposed in a second light-emitting portion 120B. The horizontal connecting portion 132c may have a width greater than a width of the first branch electrode 132.

A ratio of the width of the first branch electrode 132 to the width (or a Y-directional width) of the horizontal connecting portion 132c may range from 1:2 to 1:5. When the width ratio is lower than 1:2 (e.g., 1:1.5), the horizontal connecting portion 132c may be cut due to a step of the second separation section d2. When the width ratio is higher than 1:5, an emission area may be reduced and thus, luminous efficiency may be reduced. As an example, the width of the horizontal connecting portion 132c may range from 10 µm to 30 µm but is not limited thereto.

Referring to FIG. 6, a third light-emitting portion 120C and a fourth light-emitting portion 120D may be further disposed between a first light-emitting portion 120A and a second light-emitting portion 120B. First separation sections d1 may be disposed between a plurality of light-emitting portions.

A first electrode 130 may include a first pad 131 disposed on the first light-emitting portion 120A, a first branch electrode 132 disposed on the first light-emitting portion 120A, and a plurality of first extension electrodes 133 disposed on the remaining light-emitting portions 120B, 120C, and 120D. Furthermore, the first electrode 130 may include a first connecting portion 134 which is disposed on the first separation section d1 and connects the plurality of first extension electrodes 133.

A second electrode 140 may include a second pad 141 disposed on the second light-emitting portion 120B, a second branch electrode 142 disposed on the second light-emitting portion 120B, and a plurality of second extension electrodes 143 disposed on the remaining light-emitting portions 120A, 120C, and 120D. In addition, the second electrode 140 may include a second connecting portion 144 which is disposed on the first separation section d1 to connect the plurality of first extension electrodes 133.

Referring to FIG. 7, a first electrode 130 may include two first branch electrodes 132 disposed on a first light-emitting portion 120A and two first extension electrodes 133 disposed on a second light-emitting portion 120B. A second electrode 140 may include three second branch electrodes 142 disposed on the second light-emitting portion 120B and three second extension electrodes 143 disposed on the first light-emitting portion 120A. A first connecting portion 134 may connect the first branch electrodes 132 to the first extension electrodes 133, and a second connecting portion 144 may connect the second branch electrodes 142 to the second extension electrodes 143.

Due to the above-described configuration, since the number of the first and second branch electrodes 132 and 142 per light-emitting portion is increased, current injection efficiency and current distribution efficiency are improved. Accordingly, luminous efficiency may be improved.

Referring to FIG. 8, a first electrode 130 includes a first pad 131 and two first branch electrodes 132 which are disposed on a semiconductor structure 120. The first pad 131 may be disposed on a central line C1, which bisects the semiconductor structure 120 in a first direction. The semiconductor structure 120 may be divided into a first region P51, which is disposed on one side based on the central line C1, and a second region P52 which is disposed on another side of the central line C1.

The second electrode 140 may include a (2-1)th pad 141a disposed in a first region P51, a (2-2)th pad 141b disposed in a second region P52, a (2-1)th branch electrode 142 connected to the (2-1)th pad 141a, a (2-2)th branch electrode 142 connected to the (2-2)th pad 141b, and a connecting portion 146 configured to connect the (2-1)th pad 141a to the (2-2)th pad 141b.

According to the exemplary embodiment, the plurality of pads of the second electrode 140 may be disposed in a single semiconductor structure 120, thereby improving hole injection efficiency. Further, resistance of a large-sized chip may be reduced.

FIG. 9 is a graph showing measurement results of emission intensities Po of Comparative Example and Examples.

Referring to FIG. 9, Comparative Example Eo is a basic structure in which a first electrode 130 and a second electrode 140 are disposed in one light-emitting portion. Relative emission intensities of Examples were measured based on an emission intensity of Comparative Example Eo.

From measurement results, it can be seen that the emission intensities of Examples were improved as compared to the emission intensity of Comparative Example Eo. That is, it can be seen that when a semiconductor structure is divided into a plurality of portions and the portions are connected in parallel, relatively high luminous flux and optical efficiency may be obtained.

FIG. 10 is a plan view of a semiconductor device package according to an exemplary embodiment of the present invention.

Referring to FIG. 10, the semiconductor device package according to the exemplary embodiment may include a body 1001 including a cavity 1010, a first lead frame 1002 and a second lead frame 1003 disposed on the body 1001, and a semiconductor device 10 disposed in the cavity 1010.

The body 1001 may be formed of at least one of a resin material, such as polyphthalamide (PPA), silicon (Si), aluminum (Al), aluminum nitride (AlN), AlOx, a liquid crystal polymer (or photo sensitive glass (PSG)), polyamide 9T (PA9T), syndiotactic polystyrene (SPS), a metal material, sapphire (Al2O3), beryllium oxide (BeO), ceramics, and a printed circuit board (PCB).

An upper surface of the body 1001 may have various shapes, such as a triangular shape, a tetragonal shape, a polygonal shape, and a circular shape, depending on the purpose and design of the semiconductor device 10.

A sectional shape of the cavity 1010 may have a cup shape, a concave vessel shape, or the like, and an inner side surface of the cavity 1010 may be inclined with respect to a lower portion thereof. Further, a front surface of the cavity 1010 may have a circular shape, a tetragonal shape, a polygonal shape, an elliptical shape, or the like, but is not limited thereto.

An inner sidewall of the cavity 1010 may form an inclined surface. A reflection angle of light emitted from the semiconductor device 10 may vary according to an angle of the inclined surface, and thus, an orientation angle of light emitted to the outside may be adjusted. As the orientation angle of light is reduced, the concentration of light emitted from the semiconductor device to the outside may increase. In contrast, as the orientation angle of light increases, the concentration of light emitted from the semiconductor device to the outside may be reduced.

The first and second lead frames 1002 and 1003 may include a metal material, for example, at least one material of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), and iron (Fe) or an alloy thereof.

All the above-described components may be applied to the semiconductor device 10. When viewed from above, the semiconductor device 10 according to the exemplary embodiment may have first to fourth regions as in FIG. 2. A first pad 131 may be disposed in the second region, and a second pad 141 may be disposed in the fourth region.

The first pad 131 may be electrically connected to the first lead frame 1002 by a first wire 1004, and the second pad 141 may be electrically connected to the second lead frame 1003 by a second wire 1005.

According to an embodiment, since a plurality of light-emitting portions are connected in parallel on a chip level, the number of wires may be reduced. Further, optical efficiency may be improved due to the parallel connection.

FIG. 11 is a plan view of a semiconductor device according to a sixth exemplary embodiment of the present invention. FIG. 12A is an enlarged view of a second region of FIG. 11. FIG. 12B is an enlarged view of a fourth region of FIG. 11. FIG. 13 is a plan view of a semiconductor device package according to another exemplary embodiment of the present invention.

Referring to FIG. 11, the semiconductor device according to the exemplary embodiment includes a first light-emitting portion 120A and a second light-emitting portion 120B. The first and second light-emitting portions 120A and 120B may be formed using an isolation process in the same semiconductor structure. Each of the first light-emitting portion 120A and the second light-emitting portion 120B may include a first-conductive-type semiconductor layer, an active layer, and a second-conductive-type semiconductor layer. The structures described with reference to FIGS. 2 to 4 may be wholly applied to the remaining configuration except for sub-pads.

Each of the first and second light-emitting portions 120A and 120B may be a separately manufactured semiconductor device. When the first and second light-emitting portions 120A and 120B are the separately manufactured semiconductor devices, the active layers of the first and second light-emitting portions 120A and 120B may have different compositions from each other. As an example, the active layer of the first light-emitting portion 120A may emit blue light, and the active layer of the second light-emitting portion 120B may emit green light. Accordingly, various kinds of semiconductor devices may be connected in parallel. Hereinafter, light-emitting portions isolated from one semiconductor structure will be described.

Each of the first light-emitting portion 120A and the second light-emitting portion 120B may include a first electrode 130 electrically connected to the first-conductive-type semiconductor layer and a second electrode 140 electrically connected to the second-conductive-type semiconductor layer.

The first electrode 130 may include a first pad 131 and a first branch electrode 132, and the second electrode 140 may include a second pad 141 and a second branch electrode 142. In this case, the first electrode 130 of the first light-emitting portion 120A may further include a first sub-pad 137, and the second electrode 140 of the second light-emitting portion 120B may further include a second sub-pad 147.

A third wire 1007 may electrically connect the first pad 131 disposed in the first light-emitting portion 120A to the first pad 131 disposed in the second light-emitting portion 120B. A fourth wire 1006 may electrically connect the second pad 141 disposed in the first light-emitting portion 120A to the second pad 141 disposed in the second light-emitting portion 120B. Accordingly, the first light-emitting portion 120A and the second light-emitting portion 120B may be connected in parallel by the third and fourth wires 1007 and 1006.

The third wire 1007 and the fourth wire 1006 may be silver wires. Since a typically used gold wire absorbs light in a blue wavelength range, selecting a silver wire having a high reflectance may be preferred. A diameter of the silver wire may range from 0.7 mm to 0.9 mm but is not limited thereto. Further, the third wire 1007 and the fourth wire 1006 may be wires coated with silver (Ag). According to an exemplary embodiment, since a plurality of light-emitting portions are connected by wires, operating voltages of light-emitting portions may be constant.

According to an exemplary embodiment, since the first pad 131 of the first light-emitting portion 120A is connected to the first pad 131 of the second light-emitting portion 120B by the third wire 1007 and since the second pad 141 of the first light-emitting portion 120A is connected to the second pad 141 of the second light-emitting portion 120B by the fourth wire 1006, a pad to be connected with a lead frame may be additionally needed. Accordingly, the first electrode 130 of the first light-emitting portion 120A may further include the first sub-pad 137, and the second electrode 140 of the second light-emitting portion 120B may further include the second sub-pad 147. The first pad 131 and the first sub-pad 137 may have the same shape, and the second pad 141 and the second sub-pad 147 may have the same shape. However, shapes of the first and second sub-pads 137 and 147 are not limited thereto.

When viewed from above, the semiconductor device may include first to fourth regions P1, P2, P3, and P4, which are divided by a first side surface S1 and a third side surface S3 which are opposite to each other, a second side surface S2 and a fourth side surface S4 which are opposite to each other, a first central line C1 bisecting the first side surface S1, and a second central line C2 bisecting the second side surface S2.

The first region P1 may include the first side surface S1 and the second side surface S2, and the second region P2 may include the second side surface S2 and the third side surface S3. The third region P3 may include the third side surface S3 and the fourth side surface S4, and the fourth region P4 may include the fourth side surface S4 and the first side surface S1.

According to an exemplary embodiment, the first sub-pad 137 is disposed in the second region P2, and the second sub-pad 147 is disposed in the fourth region P4. That is, the first sub-pad 137 and the second sub-pad 147 may be disposed in a diagonal direction. Due to the above-described configuration, chip resistance may be improved, and current distribution efficiency may be increased.

Referring to FIG. 12A, the second region P2 may be divided into (2-1)th to (2-4)th sub-regions P21, P22, P23, and P24 by a third central line C11 bisecting the third side surface S3 and a fourth central line C21 bisecting the second side surface S2.

The (2-1)th sub-region P21 may include the second central line C2 and the second side surface S2, and the (2-2)th sub-region P22 may include the second side surface S2 and the third side surface S3. The (2-3)th sub-region P23 may include the third side surface S3 and the first central line C1, and the (2-4)th sub-region P24 may include the first central line C1 and the second central line C2. The first sub-pad 137 according to an exemplary embodiment may be disposed in the (2-2)th sub-region P22.

Referring to FIG. 12B, the fourth region P4 may be divided into (4-1)th to (4-4)th sub-regions P41, P42, P43, and P44 by a fifth central line C12 bisecting the first side surface S1 and a sixth central line C22 bisecting the fourth side surface S4.

The (4-1)th sub-region P41 may include the first side surface S1 and the first central line C1, and the (4-2)th sub-region P42 may include the first central line C1 and the second central line C2. The (4-3)th sub-region P43 may include the second central line C2 and the fourth side surface S4, and the (4-4)th sub-region P44 may include the fourth side surface S4 and the first side surface S1. The second sub-pad 147 according to an exemplary embodiment may be disposed in the (4-4)th sub-region P44. That is, the first sub-pad 137 and the second sub-pad 147 may be disposed in a diagonal direction. Due to the above-described configuration, chip resistance may be improved, and current distribution efficiency may be increased.

Referring to FIG. 13, the semiconductor device package according to the exemplary embodiment may include a body 1001 including a cavity 1010, first and second lead frames 1002 and 1003 disposed on the body 1001, and a semiconductor device 10 disposed in the cavity 1010.

The body 1001 may be formed of at least one of a resin material, such as polyphthalamide (PPA), silicon (Si), aluminum (Al), aluminum nitride (AlN), AlOx, a liquid crystal polymer (or photo sensitive glass (PSG)), polyamide 9T (PA9T), syndiotactic polystyrene (SPS), a metal material, sapphire (Al2O3), beryllium oxide (BeO), ceramics, and a printed circuit board (PCB).

An upper surface of the body 1001 may have various shapes such as a triangular shape, a tetragonal shape, a polygonal shape, and a circular shape, depending on the purpose and design of the semiconductor device.

A sectional shape of the cavity 1010 may have a cup shape, a concave vessel shape, or the like, and an inner side surface of the cavity 1010 may be inclined with respect to a lower portion thereof. Further, a front surface of the cavity 1010 may have a circular shape, a tetragonal shape, a polygonal shape, an elliptical shape, or the like, but is not limited thereto.

An inner sidewall of the cavity 1010 may form an inclined surface. A reflection angle of a light emitted from the semiconductor device may vary depending on an angle of the inclined surface, and thus, an orientation angle of light emitted to the outside may be adjusted. The lower the orientation angle of light, the higher the concentration characteristics of light emitted from the semiconductor device to the outside, whereas the higher the orientation angle of light, the smaller the concentration characteristics of light emitted from the semiconductor device to the outside.

The first and second lead frames 1002 and 1003 may include a metal material, for example, at least one material of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), and iron (Fe) or an alloy thereof.

All the above-described components may be applied to the semiconductor device. When viewed from above, the semiconductor device according to the exemplary embodiment may have first to fourth regions P1, P2, P3, and P4 as in FIG. 2. A first sub-pad 137 may be disposed in the second region P2, and a second sub-pad 147 may be disposed in the fourth region P4.

The first sub-pad 137 may be electrically connected to the first lead frame 1002 by a first wire 1004, and the second sub-pad 147 may be electrically connected to the second lead frame 1003 by a second wire 1005.

A third wire 1007 may electrically connect first pads 131 of a first light-emitting portion 120A and a second light-emitting portion 120B, and a fourth wire 1006 may electrically connect second pads 141 of the first light-emitting portion 120A and the second light-emitting portion 120B.

The third wire 1007 and the fourth wire 1006 may be silver wires. Since a typically used gold wire absorbs light in a blue wavelength range, selecting a silver wire having a high reflectance may be preferred. A diameter of the silver wire may range from 0.7 mm to 0.9 mm but is not limited thereto. Further, the third wire 1007 and the fourth wire 1006 may be wires coated with silver (Ag). According to an exemplary embodiment, since a plurality of light-emitting portions are connected by wires, operating voltages of light-emitting portions may be constant.

The semiconductor device may be used as a light source of a lighting system or used as a light source of an image display device or a light source of a lighting device. That is, the semiconductor device may be disposed in a case and applied to various electronic devices configured to provide light. As an example, when the semiconductor device is mixed with an RGB phosphor and used, white light with a high color rendering index (CRI) may be implemented.

The above-described semiconductor device may be included in a light emitting device package and used as a light source of a lighting system. For example, the semiconductor device may be used as a light source of an image display device or a light source of a lighting device or the like.

When the semiconductor device is used as a backlight unit of an image display device, the semiconductor device may be used as an edge-light-type backlight unit or a direct-light-type backlight unit. When the semiconductor device is used as a light source of a lighting device, the semiconductor device may be used as a lamp or bulb type. Alternatively, the semiconductor device may be used as a light source of a mobile terminal.

Light-emitting devices may include a laser diode in addition to the above-described LED.

Like the light-emitting device, the laser diode may include a first-conductive-type semiconductor layer, an active layer, and a second-conductive-type semiconductor layer, which have the above-described structures. Further, the laser diode may be based on an electroluminescence phenomenon in which light is emitted when a current is supplied after a first-conductive-type (or p-type) semiconductor is bonded to a second-conductive-type (or n-type) semiconductor. However, the laser diode differs from the light-emitting device in terms of directionality and phase of the emitted light. That is, the laser diode may be based on phenomena, such as stimulated emission, constructive interference, and the like, and emit light (or monochromatic beams) having a single specific wavelength and the same phase in the same direction. Due to these characteristics, the laser diode may be used for an optical communication device, a medical device, a semiconductor processing device, and the like.

A light-receiving device may include, for example, a photodetector (PD), which is a kind of transducer configured to detect light and convert an intensity of the light into an electric signal. The photodetector may include a photocell (silicon and selenium), an optical output element (cadmium sulfide and cadmium selenide), a photodiode (e.g., a photodiode having a peak wavelength in a visible blind spectral region or a true blind spectral region), a photo transistor, a photomultiplier, a photoelectric tube (vacuum and gas filling), an infra-red (IR) detector, or the like, but the embodiments are not limited thereto.

In addition, semiconductor devices, such as a photodetector, may be typically manufactured using a direct bandgap semiconductor having excellent photoelectric conversion efficiency. Alternatively, photodetectors may have various structures, and most typical structures of the photodetectors include a pin-type photodetector using a p-n junction, a Schottky-type photodetector using a Schottky junction, a metal-semiconductor-metal (MSM)-type photodetector, or the like.

Like a light-emitting device, a photodiode may include a first conductive semiconductor layer, an active layer, and a second conductive semiconductor layer, which have the above-described structures. The photodiode has a p-n junction or pin structure. The photodiode operates with the application of a reverse bias or a zero bias. When light is incident to the photodiode, electrons and holes are generated to allow the flow of current. In this case, an amount of current may be approximately proportional to an intensity of the light incident to the photodiode.

A photocell or a solar cell, which is a kind of a photodiode, may convert light into current. Like the light-emitting device, the solar cell may include a first conductive semiconductor layer, an active layer, and a second conductive semiconductor layer, which have the above-described structures.

In addition, the photodiode may be used as a rectifier of an electronic circuit due to rectification characteristics of a typical diode using a p-n junction and may be applied to an ultrahigh frequency circuit and used for an oscillation circuit or the like.

Furthermore, the above-described semiconductor device is not necessarily implemented only by semiconductors and may further include a metal material in some cases. For example, a semiconductor device, such as a light-receiving device, may be implemented using at least one of silver (Ag), aluminum (Al), gold (Au), indium (In), gallium (Ga), nitrogen (N), zinc (Zn), selenium (Se), phosphorus (P), and arsenic (As) or may be implemented using a semiconductor material doped with a p-type or n-type dopant or an intrinsic semiconductor material.

While the invention has been particularly shown and described with reference to the exemplary embodiments thereof, the exemplary embodiments are merely examples and are not intended to limit the present invention, and it will be understood by those skilled in the art that various changes and modifications may be made therein without departing from essential characteristics of the present embodiments. For example, each component specified in exemplary embodiments may be modified and implemented. Further, all differences related to the changes and modifications will be construed as being included in the scope and spirit of the present invention as defined the appended claims.

The invention claimed is:

1. A semiconductor device comprising:
a semiconductor structure comprising a first light-emitting portion and a second light-emitting portion;
a first electrode configured to electrically connect a first-conductive-type semiconductor layer of the first light-emitting portion to a first-conductive-type semiconductor layer of the second light-emitting portion; and
a second electrode configured to electrically connect a second-conductive-type semiconductor layer of the first light-emitting portion to a second-conductive-type semiconductor layer of the second light-emitting portion,
wherein the first electrode comprises a first pad disposed on the first light-emitting portion, a first branch electrode disposed on the first light-emitting portion, and a first extension electrode disposed on the second light-emitting portion,
the second electrode comprises a second pad disposed on the second light-emitting portion, a second branch electrode disposed on the second light-emitting portion, and a second extension electrode disposed on the first light-emitting portion,
the semiconductor structure comprises a first separation section extending in a first direction to separate the first light-emitting portion from the second light-emitting portion, and
the first pad does not overlap the second pad in the first direction and a second direction perpendicular to the first direction wherein the semiconductor structure comprises a first region, a second region, a third region, and a fourth region, which are divided by a first side surface and a third side surface which are opposite to each other, a second side surface and a fourth side surface which are opposite to each other, a first central line bisecting the first side surface, and a second central line bisecting the second side surface when viewed from above,
wherein the first region comprises the first side surface and the second side surface, the second region comprises the second side surface and the third side surface, the third region comprises the third side surface and the fourth side surface, and the fourth region comprises the fourth side surface and the first side surface, and the first pad is disposed in the second region, and the second pad is disposed in the fourth region.

2. The semiconductor device of claim 1, wherein the first electrode and the second electrode connect the first light-emitting portion to the second light-emitting portion in parallel.

3. The semiconductor device of claim 1, wherein the number of second branch electrodes is larger than the number of first branch electrodes.

4. The semiconductor device of claim 1, further comprising a current blocking layer disposed below the second branch electrode.

5. The semiconductor device of claim 4, wherein the first electrode comprises a first connecting portion disposed on the first separation section,
wherein a width of the first connecting portion is greater than a width of the first branch electrode.

6. The semiconductor device of claim 1, wherein the first branch electrode is disposed on a virtual line bisecting the first light-emitting portion in the first direction.

7. The semiconductor device of claim 1, further comprising a second separation section extending in the second direction to separate the first light-emitting portion from the second light-emitting portion,
wherein the first central line is disposed in the second separation section.

8. The semiconductor device of claim 7, wherein the first electrode comprises a second connecting portion disposed on the second separation section, and
a width of the second connecting portion is greater than a width of the second branch electrode.

9. The semiconductor device of claim 1, wherein the first light-emitting portion and the second light-emitting portion each emit a different color light.

10. A semiconductor device package comprising:
a body comprising a cavity;
a first lead frame and a second lead frame disposed on the body;
a semiconductor device disposed in the cavity;
a first wire configured to electrically connect a first pad of the semiconductor device to the first lead frame; and
a second wire configured to electrically connect a second pad of the semiconductor device to the second lead frame,
wherein the semiconductor device comprises:
a semiconductor structure comprising a first light-emitting portion and a second light-emitting portion;
a first electrode configured to electrically connect a first-conductive-type semiconductor layer of the first light-emitting portion to a first-conductive-type semiconductor layer of the second light-emitting portion; and
a second electrode configured to electrically connect a second-conductive-type semiconductor layer of the first light-emitting portion to a second-conductive-type semiconductor layer of the second light-emitting portion,
wherein the first electrode comprises the first pad disposed on the first light-emitting portion, a first branch electrode disposed on the first light-emitting portion, and a first extension electrode disposed on the second light-emitting portion,
the second electrode comprises the second pad disposed on the second light-emitting portion, a second branch electrode disposed on the second light-emitting portion, and a second extension electrode disposed on the first light-emitting portion,
the semiconductor structure comprises a first separation section extending in a first direction to separate the first light-emitting portion from the second light-emitting portion, and
the first pad does not overlap the second pad in the first direction and a second direction perpendicular to the first direction wherein the semiconductor package further comprising a first region, a second region, a third region, and a fourth region, which are divided by a first side surface and a third side surface which are opposite to each other, a second side surface and a fourth side surface which are opposite to each other, a first central line bisecting the first side surface, and a second central line bisecting the second side surface when viewed from above, wherein the first region comprises the first side surface and the second side surface, the second region comprises the second side surface and the third side surface, the third region comprises the third side surface and the fourth side surface, and the fourth region comprises the fourth side surface and the first side surface, and the first pad is disposed in the second region, and the second pad is disposed in the fourth region.

11. The semiconductor device package of claim 10, wherein the first electrode and the second electrode connect the first light-emitting portion to the second light-emitting portion in parallel.

12. The semiconductor device package of claim 10, wherein the number of second branch electrodes is larger than the number of first branch electrodes.

13. The semiconductor device package of claim 10, further comprising a current blocking layer disposed below the second branch electrode.

14. The semiconductor device package of claim 13, wherein the first electrode comprises a first connecting portion disposed on the first separation section,
wherein a width of the first connecting portion is greater than a width of the first branch electrode.

15. The semiconductor device package of claim 10, wherein the first branch electrode is disposed on a virtual line bisecting the first light-emitting portion in the first direction.

16. The semiconductor device package of claim 13, further comprising a second separation section extending in the second direction to separate the first light-emitting portion from the second light-emitting portion,
wherein the first central line is disposed in the second separation section.

17. The semiconductor device package of claim 16, wherein the first electrode comprises a second connecting portion disposed on the second separation section, and
a width of the second connecting portion is greater than a width of the second branch electrode.

18. The semiconductor device package of claim 10, wherein the first light-emitting portion and the second light-emitting portion each emit a different color light.

* * * * *